(12) United States Patent
Kuo et al.

(10) Patent No.: US 8,034,708 B2
(45) Date of Patent: Oct. 11, 2011

(54) STRUCTURE AND PROCESS FOR THE FORMATION OF TSVS

(75) Inventors: Chen-Cheng Kuo, Chu-Pei (TW); Kai-Ming Ching, Jhudong Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/910,621

(22) Filed: Oct. 22, 2010

(65) Prior Publication Data

US 2011/0034027 A1 Feb. 10, 2011

Related U.S. Application Data

(63) Continuation of application No. 12/152,381, filed on May 14, 2008, now Pat. No. 7,843,064.

(60) Provisional application No. 61/016,220, filed on Dec. 21, 2007.

(51) Int. Cl.
*H01L 21/4763* (2006.01)

(52) U.S. Cl. ........ 438/622; 438/672; 438/118; 257/774; 257/E23.145

(58) Field of Classification Search .................. 257/758; 438/622

See application file for complete search history.

(56) References Cited

U.S. PATENT DOCUMENTS

| 6,605,528 | B1 | 8/2003 | Lin et al. |
| 6,642,081 | B1 | 11/2003 | Patti |
| 2005/0001327 | A1 | 1/2005 | Yamaguchi |
| 2005/0202602 | A1* | 9/2005 | Asami et al. .................. 438/149 |
| 2006/0249848 | A1* | 11/2006 | Coolbaugh et al. ........... 257/758 |
| 2006/0278979 | A1 | 12/2006 | Rangel |
| 2007/0045780 | A1 | 3/2007 | Akram et al. |
| 2007/0132086 | A1 | 6/2007 | Agraharam et al. |
| 2008/0006938 | A1* | 1/2008 | Patti et al. ..................... 257/734 |

FOREIGN PATENT DOCUMENTS

JP 10-335458 * 12/1998

* cited by examiner

*Primary Examiner* — Ajay K Arora
(74) *Attorney, Agent, or Firm* — Slater & Matsil, L.L.P.

(57) ABSTRACT

An integrated circuit structure includes a semiconductor substrate; an interconnect structure over the semiconductor substrate, wherein the interconnect structure comprises a top inter-metal dielectric (IMD); an opening penetrating the interconnect structure into the semiconductor substrate; a conductor in the opening; and an isolation layer having a vertical portion and a horizontal portion physically connected to each other. The vertical portion is on sidewalls of the opening. The horizontal portion is directly over the interconnect structure. The integrated circuit structure is free from passivation layers vertically between the top IMD and the horizontal portion of the isolation layer.

21 Claims, 6 Drawing Sheets

STRUCTURE AND PROCESS FOR THE FORMATION OF TSVS

This application is a continuation of patent application Ser. No. 12/152,381, entitled "Structure and Process for the Formation of TSVs," filed on May 14, 2008, which application claims the benefit of U.S. Provisional Patent Application Ser. No. 61/016,220, filed Dec. 21, 2007, and entitled "Through-Silicon Via," which applications are hereby incorporated herein by reference.

TECHNICAL FIELD

This invention relates generally to integrated circuits, and more particularly to structures and manufacturing methods of through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-silicon vias (TSVs) are often used in 3DICs and stacked dies for connecting dies. In this case, TSVs are used to connect the integrated circuits on a die to the backside of the die. In addition, TSVs are also used to provide a short grounding path to connect the ground in the integrated circuits to the backside of the die, which is typically covered by a grounded aluminum film.

FIG. 1 illustrates a conventional integrated circuit structure, which includes semiconductor chip 100 and TSV 112 formed therein. Semiconductor chip 100 includes substrate 110, on which integrated circuits (not shown) are formed. Interconnect structure 116 is formed over substrate 110, and includes a plurality of metallization layers having metal lines and vias (not shown) formed in dielectric layers (commonly referred to as inter-metal dielectrics). Passivation layer 118 (often referred to as passivation-1) is formed on a top metallization layer. Aluminum pad 122 is formed on passivation layer 118 and is connected to the metal lines in interconnect structure 116. Passivation layer 120 (often referred to as passivation-2) is formed on passivation layer 118. An opening is formed in passivation layer 120 to expose aluminum pad 122. TSV 112 is electrically connected to aluminum pad 122 through copper line 124. Isolation layer 126 is formed to isolate TSV 112 from substrate 110, wherein isolation layer 126 extends over the top surface of passivation layer 120. Through this structure, TSV 112 is electrically connected to the integrated circuits in semiconductor chip 100.

The structure shown in FIG. 1 suffers from drawbacks. The formation of passivation layers 118 and 120 are inherited from legacy processes. The stacking of passivation layer 118, 120, and insulation layer 126 not only involves more complicated manufacturing processes, but the resistance of aluminum pad 122 and the contact resistance between aluminum pad 122 and its adjoining metal features further causes the increase in RC delay. In addition, the material difference at the interface between aluminum pad 122 and overlying copper line 124 may cause delamination. Accordingly, new TSV formation processes are needed to form more reliable TSV structures without increasing the manufacturing cost.

SUMMARY OF THE INVENTION

In accordance with one aspect of the present invention, an integrated circuit structure includes a semiconductor substrate; an interconnect structure over the semiconductor substrate, wherein the interconnect structure comprises a top inter-metal dielectric (IMD); an opening penetrating the interconnect structure into the semiconductor substrate; a conductor in the opening; and an isolation layer having a vertical portion and a horizontal portion physically connected to each other. The vertical portion is on sidewalls of the opening. The horizontal portion is directly over the interconnect structure. The integrated circuit structure is free from passivation layers vertically between the top IMD and the horizontal portion of the isolation layer.

In accordance with another aspect of the present invention, an integrated circuit structure includes a semiconductor substrate; an interconnect structure over the semiconductor substrate, wherein the interconnect structure includes a top IMD; a top metal pad in the top IMD and having a top surface substantially leveled with a top surface of the top IMD; an opening extending into the interconnect structure and the semiconductor substrate; a TSV in the opening; and an isolation layer having a vertical portion and a horizontal portion physically connected to each other. The vertical portion is on sidewalls of the opening. The horizontal portion extends over the top IMD and includes an opening exposing the top metal pad. The integrated circuit structure further includes a continuous metal feature including a vertical portion extending into the opening to form the conductor, and a horizontal portion connecting the conductor and the top metal pad.

In accordance with yet another aspect of the present invention, an integrated circuit structure includes a semiconductor substrate; an interconnect structure over the semiconductor substrate, wherein the interconnect structure includes a top IMD; a top metal pad over the top IMD; an opening extending into the interconnect structure and the semiconductor substrate; a conductor in the opening; and an isolation layer having a vertical portion and a horizontal portion physically connected to each other. The top metal pad has at least a lower portion in the horizontal portion of the isolation layer. The horizontal portion extends on sidewalls and edge portions of the top metal pad. The integrated circuit structure further includes a continuous metal feature including a vertical portion extending into the opening to form the conductor, and a horizontal portion connecting the conductor and the top metal pad.

In accordance with yet another aspect of the present invention, a method of forming an integrated circuit structure includes providing a wafer. The wafer includes a semiconductor substrate; and an interconnect structure over the semiconductor substrate. The interconnect structure includes a top IMD. The method further includes forming an opening extending into the interconnect structure and the semiconductor substrate; forming an isolation layer having a vertical portion and a horizontal portion physically connected to each other, wherein the vertical portion is on sidewalls of the opening, and wherein no passivation layer is formed vertically between the top IMD and the horizontal portion of the isolation layer; filling the opening to form a conductor; and continuing the step of forming the conductor to form a horizontal metal line over the conductor.

In accordance with yet another aspect of the present invention, a method of forming an integrated circuit structure includes providing a wafer. The wafer includes a semiconductor substrate; an interconnect structure over the semiconductor substrate, wherein the interconnect structure comprises a top IMD; and a top metal pad in the top IMD, wherein a top surface of the top metal pad is substantially leveled to a top surface of the top IMD. The method further includes forming an opening extending from a top surface of the interconnect structure into the interconnect structure and the semiconductor substrate; blanket forming an isolation layer over the top IMD and extending into the opening; forming an opening in the isolation layer to expose the top metal pad; filling the opening to form a conductor; and continuing the step of forming the conductor to form a horizontal metal line over the conductor, wherein the horizontal metal line extends into the opening in the isolation layer.

In accordance with yet another aspect of the present invention, a method of forming an integrated circuit structure includes providing a wafer. The wafer includes a semiconductor substrate; and an interconnect structure over the semiconductor substrate, wherein the interconnect structure includes a top IMD. The method further includes forming a top metal pad over the top IMD; forming an opening extending from a top surface of the interconnect structure into the interconnect structure and the semiconductor substrate; blanket forming an isolation layer over the top IMD and extending into the opening, wherein the isolation layer extends on sidewalls and portions of a top surface of the top metal pad; forming an opening in the isolation layer to expose at least a portion of the top surface of the top metal pad; filling the opening to form a conductor; and continuing the step of forming the conductor to form a horizontal metal line over the conductor, wherein the horizontal metal line extends into the opening in the isolation layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel integrated circuit structure including through-silicon vias (TSVs, also referred to as through-wafer vias, or TWVs) and the method of forming the same are provided. The intermediate stages of manufacturing an embodiment of the present invention are illustrated. The variations of the embodiment are then discussed. Throughout the various views and illustrative embodiments of the present invention, like reference numbers are used to designate like elements.

Figure 1:
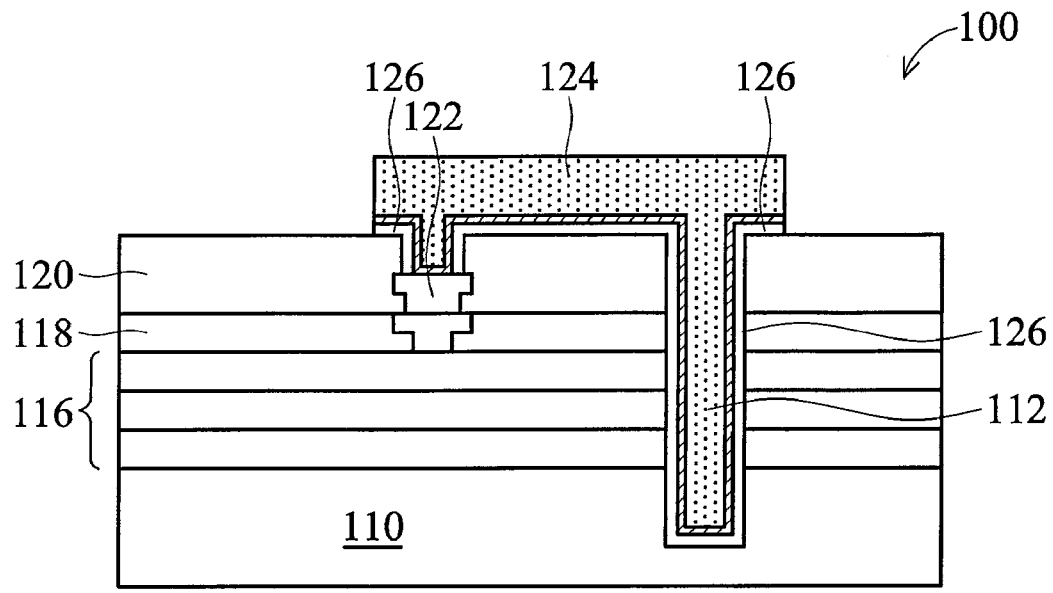
FIG. 1 illustrates a conventional backend structure, wherein a through-silicon via (TSV) is connected to an aluminum pad in a passivation layer.
Figure 2:
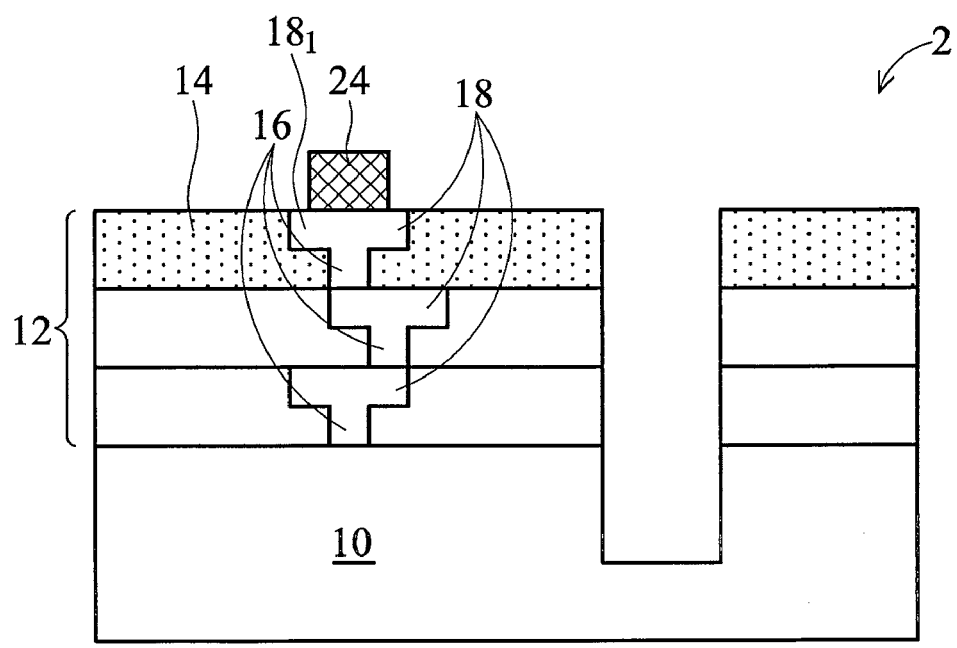
FIGS. 2 through 10 are cross-sectional views of intermediate stages in the manufacturing of embodiments of the present invention.

Referring to FIG. 2, wafer 2, which includes substrate 10, is provided. Substrate 10 is preferably a semiconductor substrate, such as a bulk silicon substrate, although it may include other semiconductor materials such as group III, group IV, and/or group V elements. Semiconductor devices, such as transistors (not shown), may be formed at the top surface of substrate 10. Interconnect structure 12, which include metal lines 18 and vias 16 formed therein, is formed over substrate 10 and connected to the semiconductor devices. Metal lines 18 and vias 16 may be formed of copper or copper alloys, and may be formed using the well-known damascene processes. Interconnect structure 12 may include commonly known inter-layer dielectric (ILD) and inter-metal dielectrics (IMDs). The IMDs include top IMD 14, which is the topmost layer of the IMDs. In an embodiment, top IMD 14 and the underlying IMD layers are formed of a same material. In other embodiments, top IMD 14 and the underlying IMD layers may be formed of either the same or different low-k dielectric materials, such as carbon-containing low-k dielectric materials (for example, with dielectric constants less than 3.9, and more preferably less than about 2.5), Black Diamond™ (a trademark of Applied Materials), un-doped silicate glass (USG), fluorinated silicate glass (FSG), oxides, and the like. Top IMD 14 does not function as a passivation layer, and preferably does not contain common passivation materials, such as silicon nitride, and the like.

Top metal pad 24 is formed on top IMD 14. Top metal pad 24 may be connected to the semiconductor devices (not shown) at the top surface of substrate 10 through vias 16 and metal lines 18. The materials of top metal pad 24 may include metals selected from aluminum, tungsten, silver, copper, and combinations thereof. In an embodiment in which top metal pad 24 is formed of aluminum or aluminum alloys, the formation of top metal pad 24 includes blanket forming an aluminum layer, and patterning the aluminum layer to form top metal pad 24. Alternatively, no further top metal pad 24 is formed on top IMD 14, and the metal pad $18_1$ in top IMD 14 acts as the top metal pad 24, as is also shown in FIG. 9B.

Figure 3:
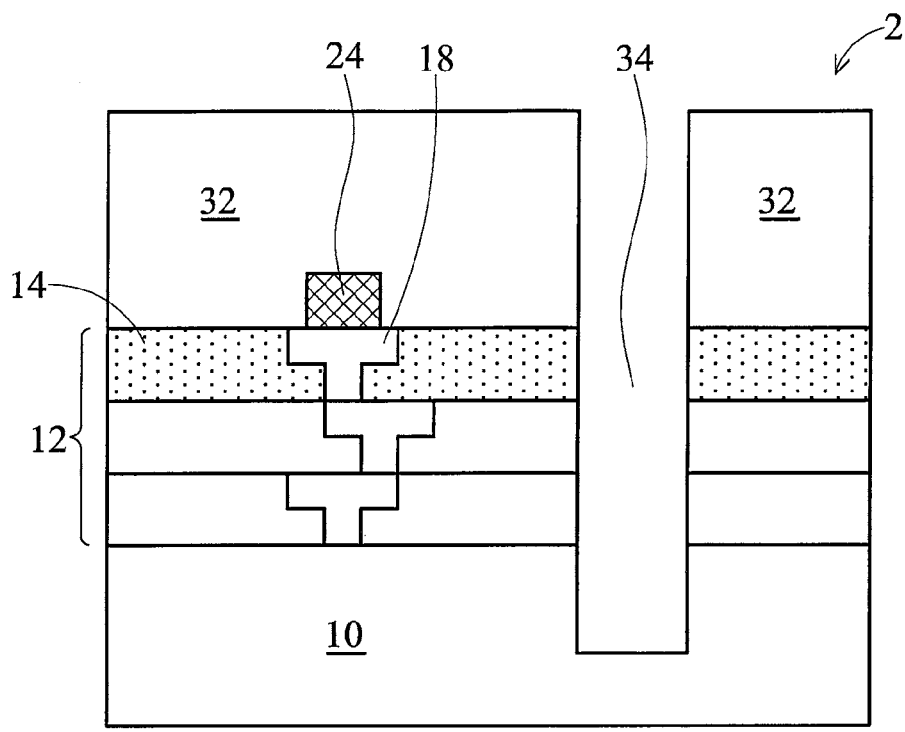

FIG. 3 illustrates the formation and patterning of photo resist 32. A first etch is then performed to form opening 34 in interconnect structure 12. Substrate 10 is then etched to extend opening 34 into substrate 10, for example, using a dry etch. After the formation of opening 34, photo resist 32 is removed.

Figure 4:
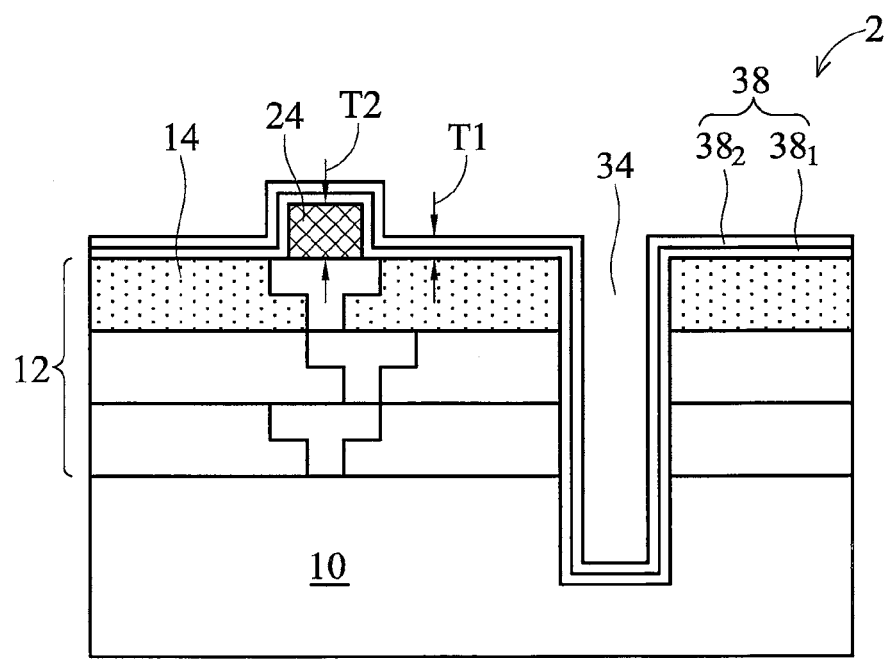
Figure 5:
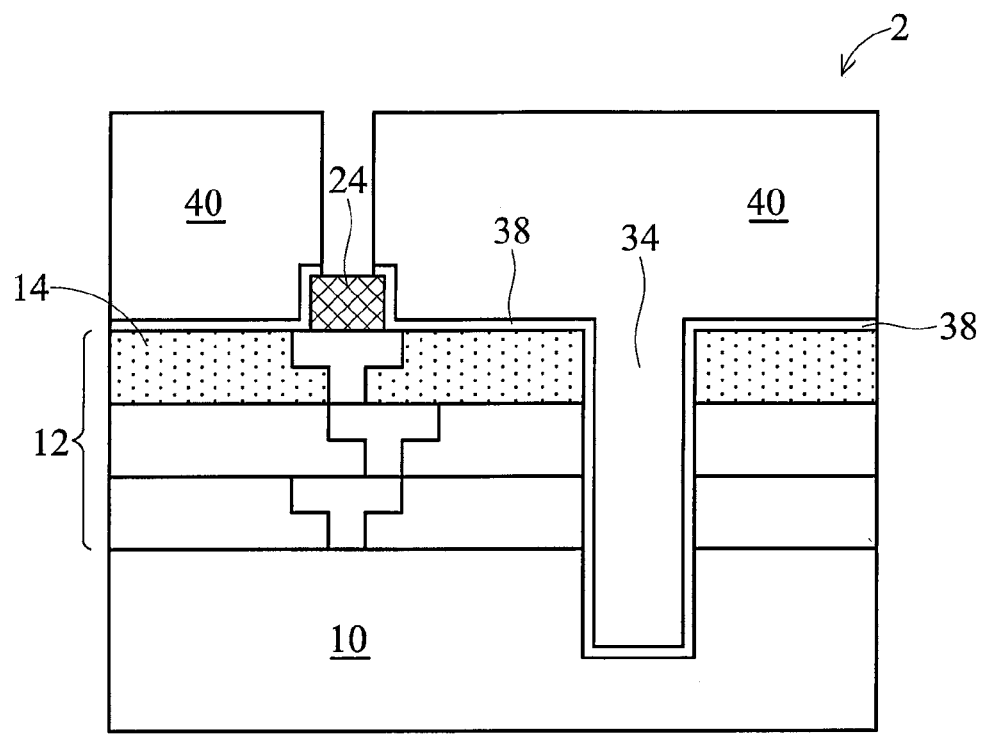

FIGS. 4 and 5 illustrate the formation of isolation layer 38. Referring to FIG. 4, isolation layer 38 is blanket formed. Isolation layer 38 may be formed of commonly used dielectric materials such as silicon nitride, silicon oxide (for example, tetra-ethyl-ortho-silicate (TEOS) oxide), and the like. In an exemplary embodiment, isolation layer 38 includes silicon nitride layer $38_2$ on silicon oxide layer $38_1$. In an embodiment, thickness T1 of isolation layer 38 is less than thickness T2 of top metal pad 24. In other embodiments, the thickness T1 of isolation layer 38 may be substantially equal to, or greater than, thickness T2 of top metal pad 24. An exemplary thickness T1 of isolation layer 38 is between about 0.6 μm and about 1.5 μm.

Referring to FIG. 5, photo resist 40 is applied, which may be a layer of spray coating. Photo resist 40 is then patterned, with the portion directly over top metal pad 24 being removed. The exposed portion of isolation layer 38 is then etched, exposing the underlying top metal pad 24. Photo resist 40 is then removed. In an embodiment, the opening over top metal pad 24 is smaller than top metal pad 24, and hence isolation layer 38 has remaining portions over the edge portions of the top metal pad 24.

Figure 6:
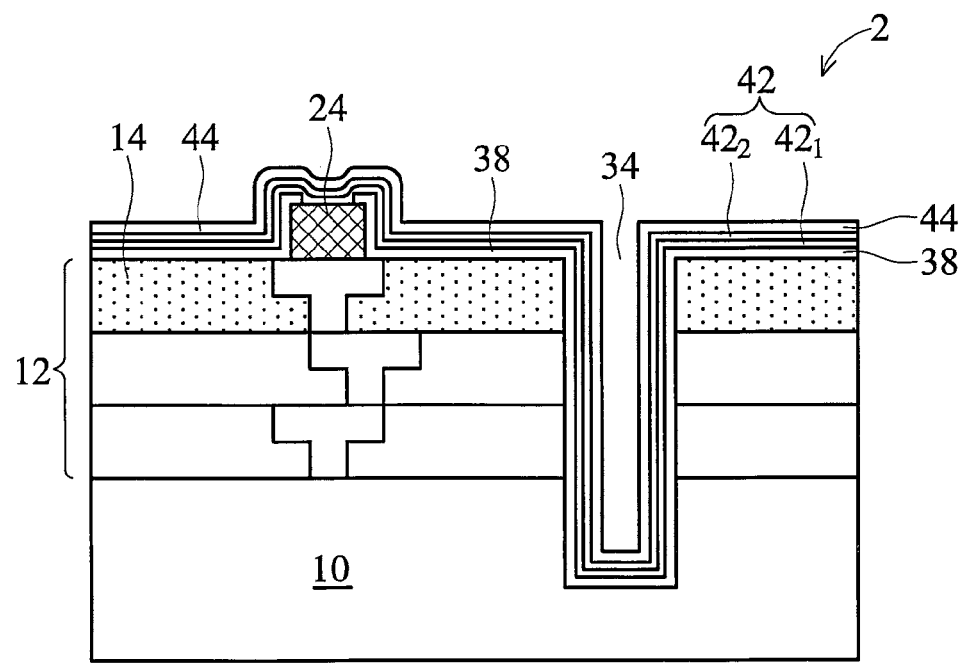

Referring to FIG. 6, diffusion barrier layer 42, also sometimes referred to as a glue layer, is blanket formed, covering the sidewalls and the bottom of opening 34. Diffusion barrier layer 42 may include titanium, titanium nitride, tantalum, tantalum nitride, or combinations thereof, and can be formed using physical vapor deposition, sputtering, and the like. Alternatively, diffusion barrier layer 42 has a composite structure including barrier layer $42_2$ on adhesion layer $42_1$.

A thin seed layer 44, also referred to as an under-bump metallurgy (UBM), is blanket formed on diffusion barrier layer 42. The materials of seed layer 44 include copper or copper alloys. However, other metals, such as silver, gold, aluminum, and combinations thereof, may also be included. In an embodiment, thin seed layer 44 is formed using sputtering. In other embodiments, physical vapor deposition or electro plating may be used. Thin seed layer 44 may have a thickness of less than about 1 μm.

Figure 7:
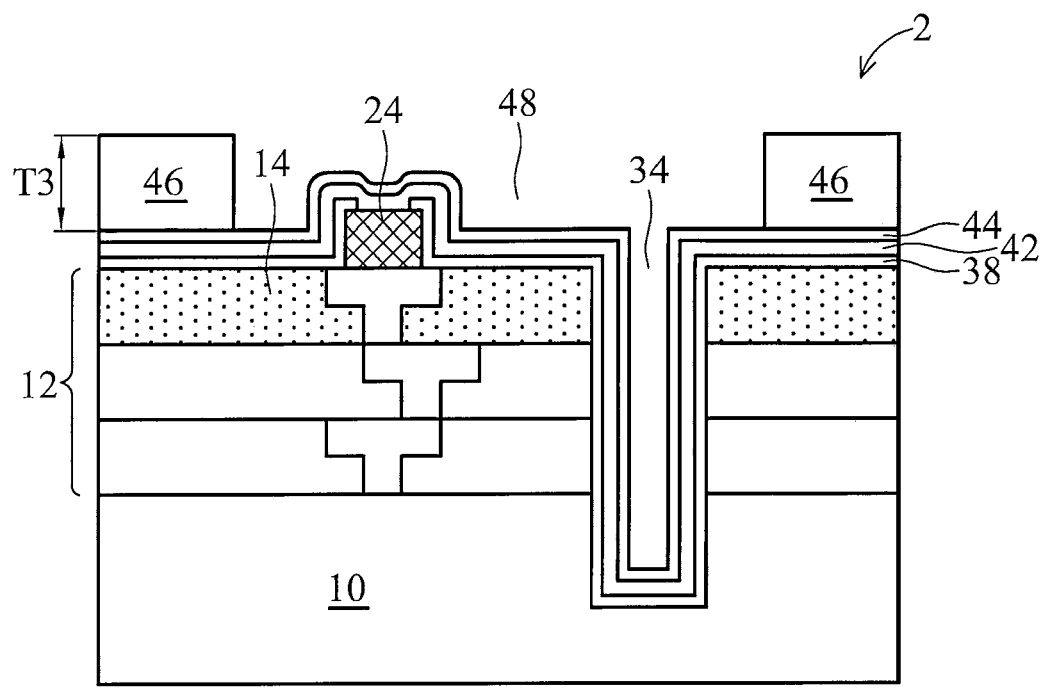

FIG. 7 illustrates the formation of mask 46. In the preferred embodiment, mask 46 is a dry film, and thus is referred to as dry film 46 throughout the description, although it may be formed of other materials. Dry film 46 may be formed of an organic material such as Ajinimoto buildup film (ABF). However, other materials such as Prepreg or resin-coated copper (RCC) can also be used. When dry film 46 is formed of ABF, the ABF film is first laminated on the structure shown in FIG. 7. Heat and pressure are then applied to the laminated film to soften it so that a flat top surface is formed. Thickness T3 of dry film 46 is preferably greater than about 5 μm, and more preferably between about 10 μm and about 100 μm. One skilled in the art will realize that the dimensions recited throughout the description are merely examples, and will be scaled with the down-scaling of integrated circuits.

Dry film 46 is then patterned. In an exemplary embodiment, the resulting TSV 50 (see FIG. 8) needs to be connected to the integrated circuits on the top surface of substrate 10 through top metal pad 24. Accordingly, opening 48 is formed in dry film 46, exposing the portions of diffusion barrier layer 42 and seed layer 44 over top metal pad 24, opening 34, and the region therebetween.

Figure 8:
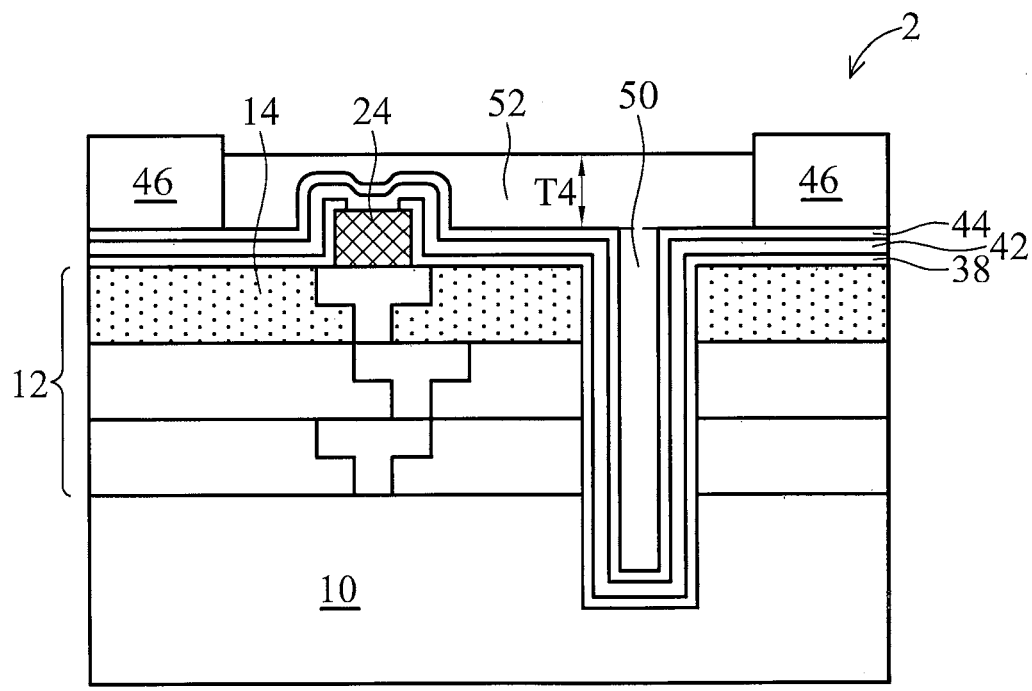

In FIG. 8, opening 34 is selectively filled with a metallic material, forming TSV 50 in opening 34. In the preferred embodiment, the filling material includes copper or copper alloys. However, other metals, such as aluminum, silver, gold, and combinations thereof, may also be used. The formation methods preferably include electroless plating, although other commonly used deposition methods such as sputtering, printing, electro plating, and chemical vapor deposition (CVD) methods may also be used.

After opening 34 is filled, the same metallic material is continuously filled into opening 48 (refer again to FIG. 8), forming metal line 52, also referred to as post-passivation interconnect (PPI) line 52, which electrically interconnects top metal pad 24 and TSV 50. Metal line 52 has a thickness T4 of less than about 60 μm, for example, between about 3 μm and about 50 μm.

Figure 9A:
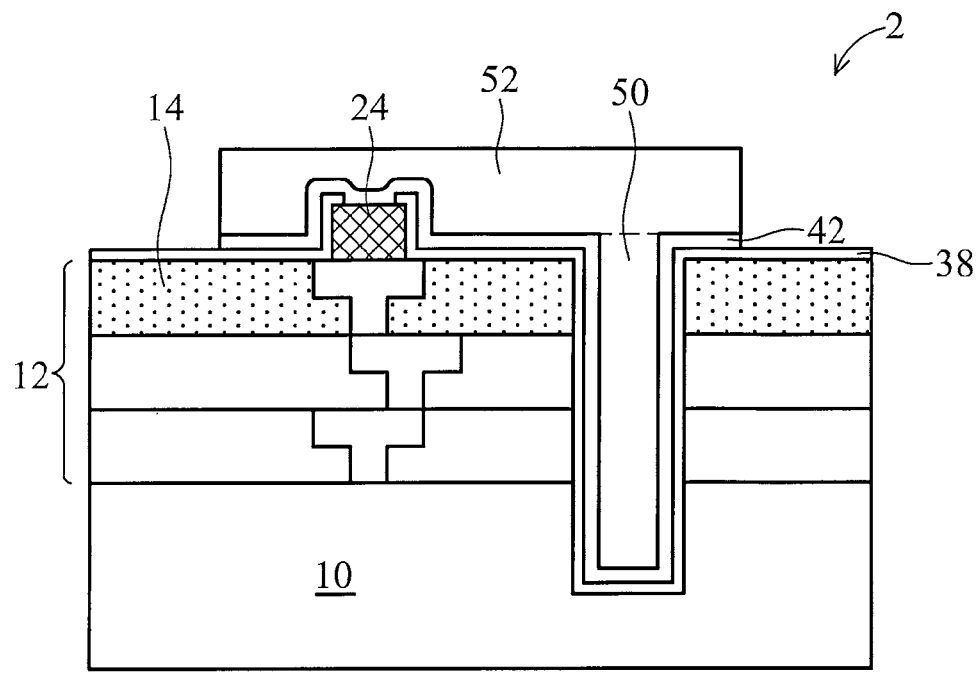
Figure 9B:
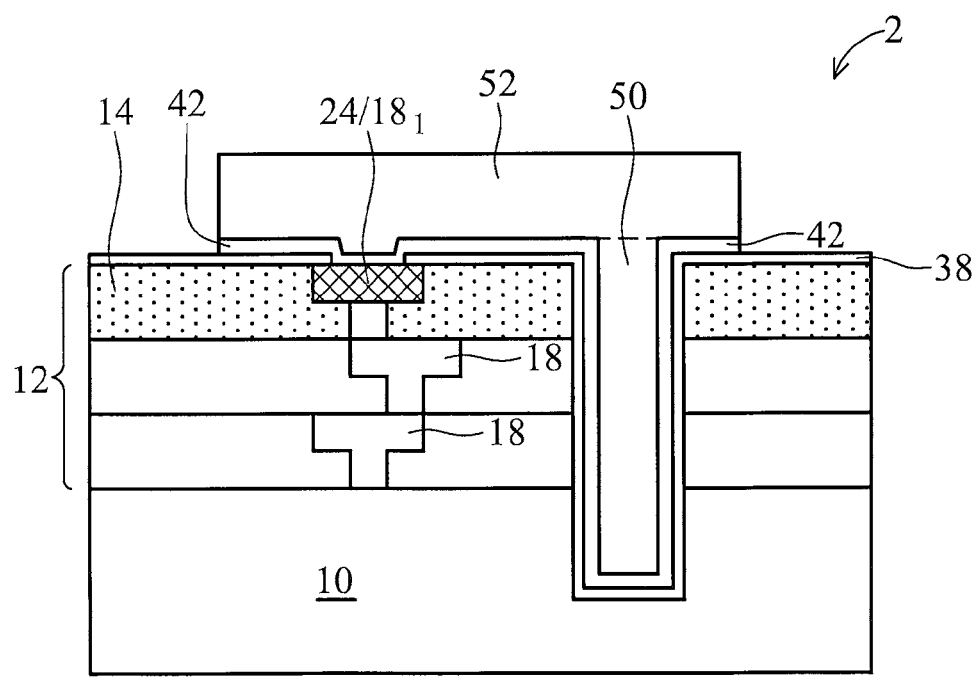

In FIG. 9A, dry film 46 is removed, for example, by an alkaline solution. As a result, the portions of UBM 44 underlying dry film 46 are exposed. The exposed portions of UBM 44 are then removed by a flash etching, followed by the removal of diffusion barrier layer 42. The etchant used for etching diffusion barrier layer 42 does not attack metal line 52. In an exemplary embodiment, the exposed portion of diffusion barrier layer 42 is removed using a fluorine-based etching gas, and the etching is preferably anisotropic. In FIG. 9A and subsequent figures, seed layer 44 is not being shown since it is typically formed of similar materials as TSV 50 and metal line 52, and thus it appears to be merged with TSV 50 and metal line 52.

FIG. 9B illustrates yet another embodiment of the present invention, in which no aluminum pad is formed over top IMD 14 to act as the top metal pad 24. Instead, metal line (or metal pad) $18_1$ in top IMD 14 acts as top metal pad 24. In this case, isolation layer 38 is substantially flat. Again, no passivation layer(s) is vertically between top IMD 14 and isolation layer 38. An opening is formed in isolation layer 38 to expose top metal pad 24/metal pad $18_1$, and metal line 52 extends into the opening to contact top metal pad 24/metal pad $18_1$.

Figure 10:
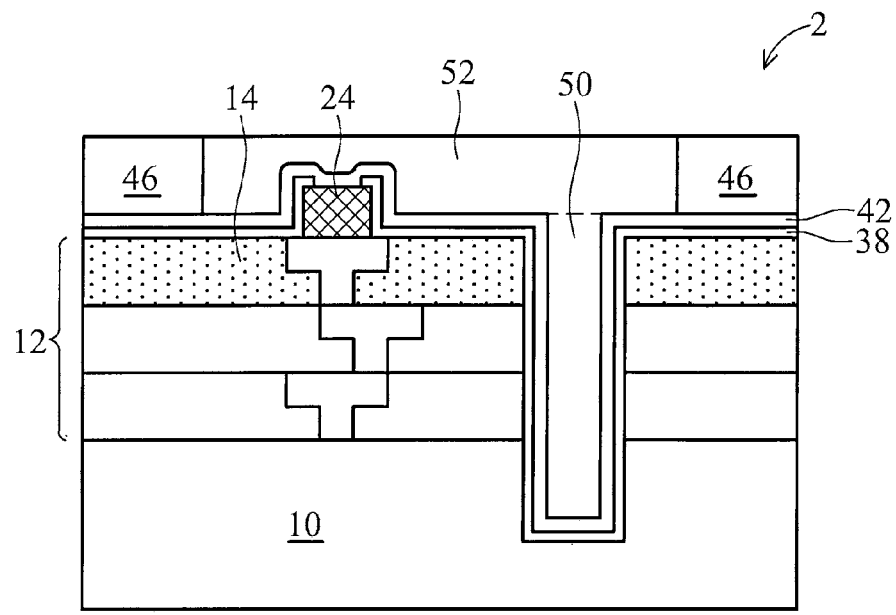

In alternative embodiments, instead of forming TSV 50 and metal line 52 using dry film, a damascene process may be used. The initial steps of this embodiment are essentially the same as shown in FIGS. 2 through 6. Referring to FIG. 7, instead of being a dry film, layer 46 may include commonly used dielectric materials such as silicon oxide, polyimide, black diamond, or the like. Layer 46 is preferably formed of a material different from that of isolation layer 38. The thickness of layer 46 is preferably equal to the desirable thickness of metal line 52 (as shown in FIG. 9A). Next, copper or copper alloy is filled into openings 34 and 48, followed by a chemical mechanical polish (CMP) to remove excess copper. The resulting structure is shown in FIG. 10. Optionally, layer 46 may then be recessed to a level lower than the top surface of metal line 52, or removed completely.

Referring back to FIG. 9A, after the removal of the exposed portion of UBM 44, portions of isolation layer 38 are exposed. The exposed portions of isolation layer 38 may not be removed and may act as a passivation layer. Alternatively, the exposed portions of isolation layer 38 may be nitrided, forming silicon oxynitride or the like.

Figure 11:
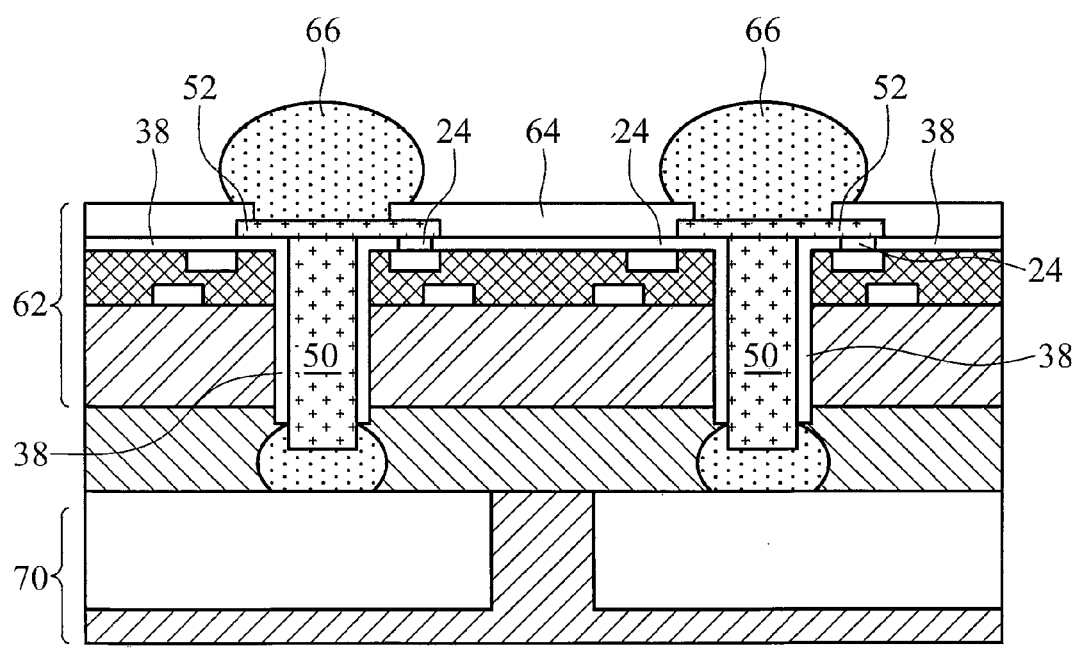
FIG. 11 illustrates a first die stacked on a second die, wherein a TSV is used to interconnect the first and the second dies.

Metal line 52 as shown in FIGS. 9A and 9B may be used as a bond pad for direct metal-to-metal bonding. In an embodiment, two dies are bonded face-to-face, and the metal line/pad 52 in one of the dies is bonded to the metal line/pad 52 in the other die. In alternative embodiments, as shown in FIG. 11, metal lines 52 may be used for placing solder bumps 66. For example, in a first die 62, protection layer 64 is formed covering edge portions of metal lines 52, while center portions of metal lines 52 are exposed through openings in protection layer 64 to form bond pads. Protection layer 64 may be formed of polyimide, for example. Solder bumps (or BGA balls) 66 are placed on bond pads 52. The bottom ends of TSVs 50 may be connected to another die 70.

Advantageously, by using the embodiment of the present invention, the redundant passivation layers, and possibly aluminum pads, are no longer formed. This results in reduced manufacturing cost. In addition, when the aluminum pad is not formed, the resistance of the interconnection structure is significantly reduced. Experiment results have revealed that by omitting the aluminum pad (refer to FIG. 9B), the resistance of the metal lines connecting TSV 50 and the semiconductor devices on substrate 10 may be reduced from about 1000 mΩ to about 100 mΩ.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   providing a wafer comprising a semiconductor substrate, and an interconnect structure over the semiconductor substrate, wherein the interconnect structure comprises a top inter-metal dielectric (IMD);
   forming a through-silicon via (TSV) opening extending into the interconnect structure and the semiconductor substrate;
   forming an isolation layer having a vertical portion and a horizontal portion physically connected to each other, wherein the vertical portion is on sidewalls of the TSV opening, and the horizontal portion is over the IMD, and wherein no passivation layer is formed in a space that extends in the vertical direction and between the top IMD and the horizontal portion of the isolation layer; and
   depositing a metallic material into the TSV opening to form a TSV.

2. The method of claim 1 further comprising, after the TSV is formed, continuing the step of depositing the metallic material until a top surface of the metallic material is higher than a top surface of the horizontal portion of the isolation layer to form a horizontal metal line over and physically connected to the TSV.

3. The method of claim 1 further comprising forming a top metal pad at a location no lower than the top IMD, wherein the top metal pad is electrically coupled to metal features in the interconnect structure.

4. The method of claim 3, wherein the top metal pad is over the top IMD and comprises aluminum.

5. The method of claim 3, wherein the top metal pad is in the top IMD and comprises copper, with a stop surface of the top metal pad substantially level with a top surface of the top IMD.

6. The method of claim 3, wherein the step of forming the isolation layer is performed after the step of forming the top metal pad, and wherein the isolation layer further comprises a first portion on a sidewall of the top metal pad and a second portion directly over and overlapping the top metal pad.

7. The method of claim 1, wherein the top IMD is formed of a low-k dielectric material, and wherein the horizontal portion of the isolation layer contacts a top surface of the low-k dielectric material.

8. The method of claim 1, wherein the step of forming the isolation layer comprises:
   forming an oxide layer; and
   forming a nitride layer over the oxide layer.

9. The method of claim 1, wherein the top IMD is formed of a low-k dielectric layer.

10. A method comprising:
    forming an interconnect structure over a semiconductor substrate, wherein the interconnect structure comprises a top inter-metal dielectric (IMD) formed of a low-k dielectric material;
    forming a top metal pad in the top IMD, wherein a top surface of the top metal pad is substantially leveled with a top surface of the top IMD;
    forming a through-silicon via (TSV) opening extending from a top surface of the interconnect structure into the interconnect structure and the semiconductor substrate;
    before forming any passivation layer, blanket forming an isolation layer comprising a portion over the top IMD and the top metal pad and a portion extending into the TSV opening;
    forming an opening in the isolation layer to expose the top metal pad;
    depositing a metallic material into the TSV opening to form a TSV; and
    continuing the step of depositing the metallic material to form a horizontal metal line over the TSV, wherein the horizontal metal line comprises a portion extending into the opening in the isolation layer and electrically coupling the top metal pad to the TSV.

11. The method of claim 10, wherein the isolation layer comprises a portion contacting a top surface of the top metal pad.

12. The method of claim 10, wherein the isolation layer comprises a portion having a bottom surface contacting a top surface of the top IMD.

13. The method of claim 12, wherein the top metal pad comprises copper.

14. The method of claim 12, wherein the top IMD comprises a low-k dielectric material.

15. The method of claim 10, wherein the step of forming the isolation layer comprises:
    forming an oxide layer; and
    forming a nitride layer on the oxide layer.

16. The method of claim 10, wherein the step of filling the TSV opening to form the TSV comprises:
    forming a diffusion barrier layer over the isolation layer;
    forming a seed layer over the diffusion barrier layer; and
    selectively plating the metallic material over the seed layer.

17. A method comprising:
    forming an interconnect structure over a semiconductor substrate, wherein the interconnect structure comprises a top inter-metal dielectric (IMD);
    forming a top metal pad over the top IMD;
    forming a through-silicon via (TSV) opening extending from a top surface of the interconnect structure into the interconnect structure and the semiconductor substrate;
    after the step of forming the top metal pad and before forming any passivation layer, blanket forming an isolation layer over the top IMD and extending into the TSV opening, wherein the isolation layer extends on sidewalls and portions of a top surface of the top metal pad;
    forming an opening in the isolation layer to expose at least a portion of the top surface of the top metal pad;
    depositing a metallic material into the TSV opening to form a TSV; and
    continuing the step of depositing the metallic material to form a horizontal metal line over the TSV, wherein the horizontal metal line extends into the opening in the isolation layer.

18. The method of claim 17, wherein the top metal pad comprises aluminum.

19. The method of claim 17, wherein the step of blanket forming the isolation layer is performed at a time a top surface of the top IMD is exposed, wherein the top IMD is formed of a low-k dielectric material, and wherein the isolation layer comprises a horizontal portion contacting a top surface of the top IMD.

20. The method of claim 17, wherein the step of forming the isolation layer comprises:

forming an oxide layer; and
forming a nitride layer on the oxide layer.

21. The method of claim 17, wherein the step of filling the TSV opening to form the TSV comprises:

forming a diffusion barrier layer on the isolation layer;
forming a seed layer on the diffusion barrier layer; and
selectively plating the metallic material on the seed layer.

* * * * *